United States Patent
Wei

(10) Patent No.: US 12,495,548 B2
(45) Date of Patent: Dec. 9, 2025

(54) SEMICONDUCTOR DEVICE AND FORMING METHOD THEREOF

(71) Applicant: Winbond Electronics Corp., Taichung (TW)

(72) Inventor: Hung-Yu Wei, Taichung (TW)

(73) Assignee: WINDBOND ELECTRONICS CORP., Taichung (TW)

(*) Notice: Subject to any disclaimer, the term of this patent is extended or adjusted under 35 U.S.C. 154(b) by 391 days.

(21) Appl. No.: 18/350,259

(22) Filed: Jul. 11, 2023

(65) Prior Publication Data
US 2024/0334688 A1    Oct. 3, 2024

(30) Foreign Application Priority Data
Mar. 29, 2023    (TW) .................................. 112111962

(51) Int. Cl.
*H10B 20/25*    (2023.01)
(52) U.S. Cl.
CPC ................... *H10B 20/25* (2023.02)
(58) Field of Classification Search
CPC ..................................................... H10B 20/25
See application file for complete search history.

(56) References Cited

U.S. PATENT DOCUMENTS

| | | |
|---|---|---|
| 8,652,855 B2 | 2/2014 | Summerfelt et al. |
| 11,605,639 B2 * | 3/2023 | Chang .............. H01L 21/28008 |

FOREIGN PATENT DOCUMENTS

| | | |
|---|---|---|
| CN | 102054817 B | 6/2013 |
| TW | I453898 B | 9/2014 |

* cited by examiner

*Primary Examiner* — Allison Bernstein
(74) *Attorney, Agent, or Firm* — Birch, Stewart, Kolasch & Birch, LLP

(57) ABSTRACT

A semiconductor device is provided. The semiconductor device includes a substrate, a first source/drain region and a second source/drain region disposed within the substrate, and a gate structure disposed on the substrate and between the first source/drain region and the second source/drain region. The semiconductor device further includes an interlayer dielectric layer disposed over the first source/drain region, the second source/drain region, and the gate structure. The interlayer dielectric layer includes a second trench extending into the second source/drain region. The semiconductor device further includes a dielectric layer disposed in the second trench, and a second source/drain contact disposed over the second source/drain region and filling the remaining portion of the second trench.

20 Claims, 11 Drawing Sheets

SEMICONDUCTOR DEVICE AND FORMING METHOD THEREOF

CROSS REFERENCE TO RELATED APPLICATIONS

This Application claims priority of Taiwan Patent Application No. 112111962, filed on Mar. 29, 2023, the entirety of which is incorporated by reference herein.

BACKGROUND OF THE INVENTION

Field of the Invention

The present invention relates to a semiconductor device, and, in particular, to a semiconductor device of an anti-fuse device.

Description of the Related Art

An integrated circuit (IC) may include anti-fuse cells. Anti-fuse cells may be used in programmable logic array (PLA) or one time programmable (OTP) memory. Technological developments have enabled the wafer area to become more and more precious, which conflicts with the high demand for area of a traditional anti-fuse cell. This conflict cannot be ignored.

BRIEF SUMMARY OF THE INVENTION

An embodiment of the present invention provides a semiconductor device. The semiconductor device comprises a substrate, a first source/drain region and a second source/drain region disposed within the substrate, and a gate structure disposed on the substrate and between the first source/drain region and the second source/drain region. The semiconductor device further comprises an interlayer dielectric layer disposed over the first source/drain region, the second source/drain region, and the gate structure. The interlayer dielectric layer comprises a second trench extending into the second source/drain region. The semiconductor device further comprises a dielectric layer disposed in the second trench, and a second source/drain contact disposed over the second source/drain region and filling the remaining portion of the second trench.

An embodiment of the present invention provides a method for forming a semiconductor device. The method comprises providing a substrate, forming a gate structure on the substrate, and forming a first source/drain region and a second source/drain region in the substrate. The first source/drain region and the second source/drain region are located on opposite sides of the gate structure. The method further comprises forming an interlayer dielectric layer on the gate structure, the first source/drain region, and the second source/drain region, and etching the interlayer dielectric layer and the second source/drain region to form a second source/drain trench. The second source/drain trench comprises a second recess within the second source/drain region. The method further comprises forming a dielectric layer in the second source/drain trench, and forming a second source/drain contact in the second source/drain trench.

DETAILED DESCRIPTION OF THE INVENTION

Figure 1A:
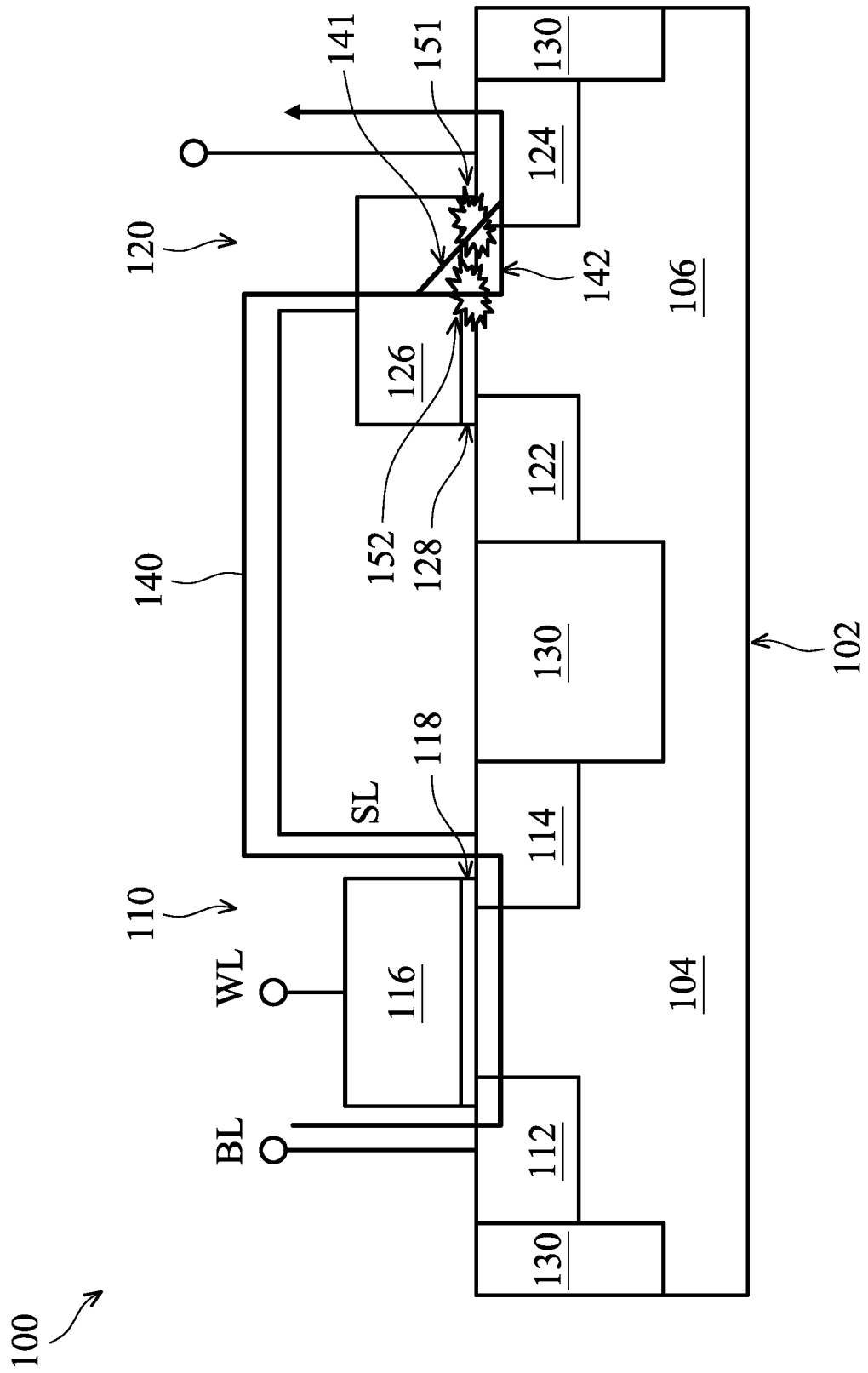
FIGS. 1A and 1B illustrate semiconductor device and layout, in accordance with prior art.

FIG. 1A illustrates a semiconductor device 100 of a conventional anti-fuse cell according to prior art. The semiconductor device 100 includes a select transistor 110 and a programming transistor 120 (i.e., an anti-fuse device) disposed on a substrate 102. The select transistor 110 and the programming transistor 120 may be metal-oxide-semiconductor field effect transistors (MOSFETs), and are disposed on a first active region 104 and a second active region 106 of the substrate 102, respectively. The select transistor 110 includes a first source/drain (S/D) region 112, a second source/drain region 114, and a first gate structure 116 including a gate dielectric layer 118. The programming transistor 120 includes a third source/drain region 122, a fourth source/drain region 124, and a second gate structure 126 including a gate dielectric layer 128. The select transistor 110 and the programming transistor 120 are separated by an isolation structure 130.

In order to program the programming transistor 120, a voltage may be applied to the first gate structure 116 through a word line WL to turn on the select transistor 110. Then, a sufficiently high voltage is applied to the first source/drain region 112 through a bit line BL, and a sufficiently low voltage is applied to the fourth source/drain region 124. The high voltage can be transmitted to the second gate structure 126 of the programming transistor 120 through the first source/drain region 112, the second source/drain region 114, and a source line SL. The voltage difference between the high voltage of the second gate structure 126 and the low voltage of the fourth source/drain region 124 is greater than or equal to a breakdown voltage, which causes the gate dielectric layer 128 of the programming transistor 120 to breakdown (or called "burn"). The path to make the gate dielectric layer 128 breakdown is shown as path 140. After the gate dielectric layer 128 is burned, the resistance between the second gate structure 126 and the fourth source/drain region 124 of the programming transistor 120 is reduced. With the high resistance before the gate dielectric layer 128 is burned and the low resistance after the gate dielectric layer 128 is burned, the programming transistor 120 can store different logic states.

However, as shown in FIG. 1A, when the path 140 leads to the fourth source/drain region 124 through a sub-path 141, the gate dielectric layer 128 will be burned in a region 151 at the edge of the second gate structure 126. It causes that a resistance between the second gate structure 126 and the fourth source/drain region 124 is lower. On the other hand, when the path 140 leads to the fourth source/drain region 124 through a sub-path 142, the gate dielectric layer 128 will be burned in a region 152 at the middle of the second gate structures 126. It causes that a resistance between the second gate structure 126 and the fourth source/drain region 124 is higher.

Therefore, for the programming transistors 120 that have been burned, the resistance distribution between the second gate structures 126 and the fourth source/drain regions 124 is not uniform. This will affect the operation of determining the logic states of the programming transistors 120. Moreover, even if the same programming transistor 120 is burned several times, the resistance between the second gate structure 126 and the fourth source/drain region 124 will not change significantly. As a result, it is difficult to uniform the resistance distribution of a plurality of programming transistors 120.

Figure 1B:
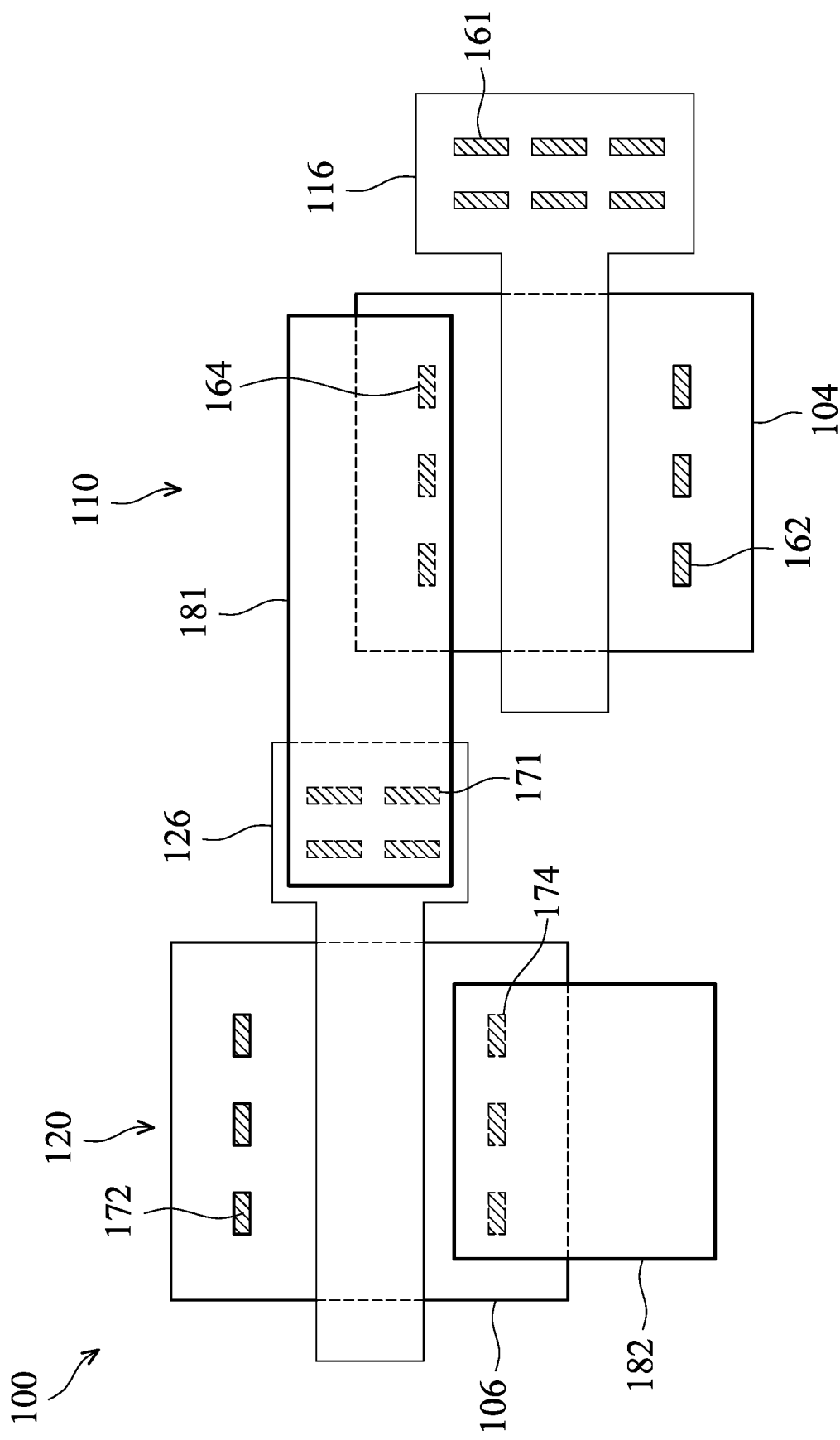

Since the conventional anti-fuse cell (e.g., the semiconductor device 100) needs two transistors, it will occupy precious area of wafer. FIG. 1B illustrate an exemplary layout of the semiconductor device 100. The select transistor 110 includes first gate contacts 161 on the first gate structure 116, first source/drain contacts 162 on the first source/drain region 112, and second source/drain contacts 164 on the second source/drain region 114. The programming transistor 120 includes second gate contacts 171 on the second gate structure 126, third source/drain contacts 172 on the third source/drain region 122, and fourth source/drain contacts 172 on the fourth source/drain region 124.

The first gate contacts 161 may be connected to the word line WL. The first source/drain contacts 162 may be connected to the bit line BL. The second source/drain contacts 164 may be connected to the second gate contacts 171 through a metal line 181, wherein the metal line 181 can be, for example, the source line SL. The third source/drain contacts 172 may be electrically floating. The fourth source/drain contacts 174 may be connected to the outside through a metal line 182. As shown in FIG. 1B, since the semiconductor device 100 includes two transistors (e.g., select transistor 110 and programming transistor 120), the semiconductor device 100 occupies a lot of wafer area. Therefore, a novel anti-fuse cell is needed to reduce the occupied wafer area.

Figure 2B:
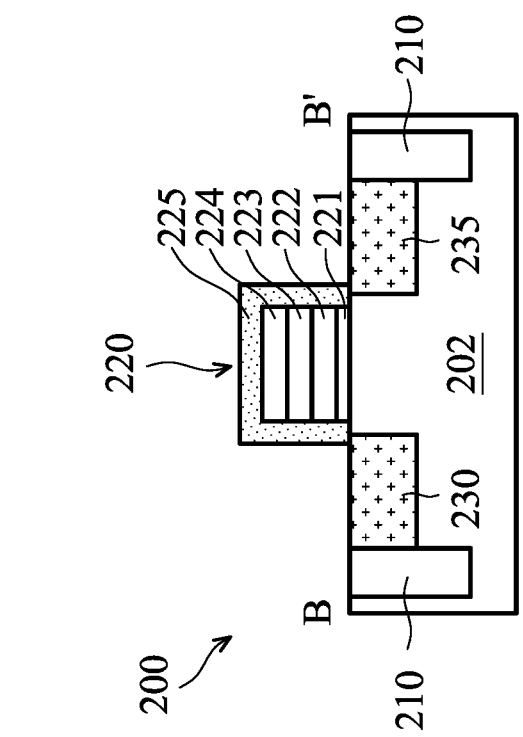
FIGS. 2B, 3 to 10, and 11B illustrate cross-sectional views of the exemplary intermediate structures during the formation of the semiconductor device, in accordance with some embodiments of the present invention.
Figure 2A:
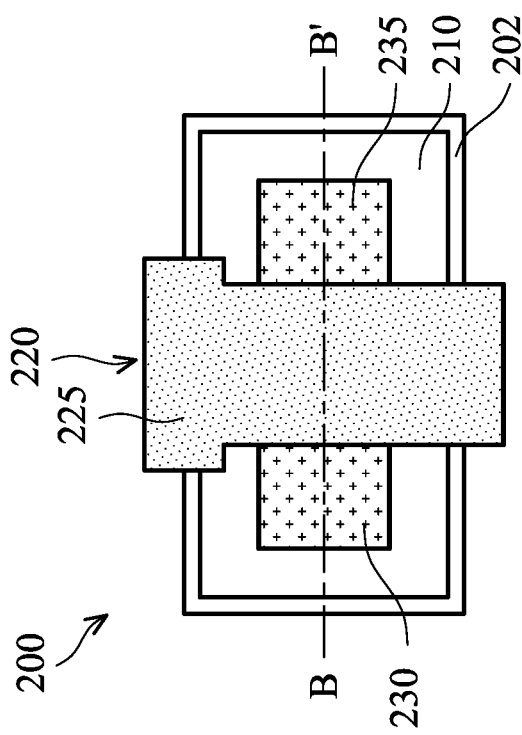
FIGS. 2A and 11A illustrate top views of exemplary intermediate structures during the formation of a semiconductor device, in accordance with some embodiments of the present invention.

FIG. 2A illustrates a top view of an exemplary intermediate structure during the formation of a semiconductor device 200 (or called anti-fuse cell). FIG. 2B illustrates a cross-sectional view taken along a line B-B' of FIG. 2A. The intermediate structure of the semiconductor device 200 includes a substrate 202, isolation structures 210, a gate structure 220, a first source/drain region 230, and a second source/drain region 235.

The isolation structures 210 may be disposed in the substrate 202 to separate the semiconductor device 200 from adjacent electronic devices. The gate structure 220 may be disposed on the substrate 202. The gate structure 220 may include a gate dielectric layer 221, a polysilicon layer 222, a gate metal layer 223, a gate cap layer 224, and a spacer layer 225. In some embodiments, the gate dielectric layer 221 may include a suitable dielectric material. In some embodiments, the gate metal layer 223 may include a suitable conductive material. In some embodiments, the gate cap layer 224 and the spacer layer 225 may include suitable dielectric materials.

The material layers of the gate dielectric layer 221, the polysilicon layer 222, the gate metal layer 223, and the gate cap layer 224 may be deposited on the substrate 202 by suitable deposition processes. Then, these material layers may be patterned by a patterning process to form the gate dielectric layer 221, the polysilicon layer 222, the gate metal layer 223, and the gate cap layer 224.

Afterward, a material layer of the spacer layer 225 may be conformally deposited on the semiconductor device 200 by a suitable deposition process. The material layer of the spacer layer 225 covers the stack constituted by the gate dielectric layer 221, the polysilicon layer 222, the gate metal layer 223, and the gate cap layer 224. Then portions of the material layer of the spacer layer 225 may be removed by an etching process to form the spacer layer 225. In some embodiments, the spacer layer 225 is formed to cover a top surface of the gate cap layer 224 and sidewalls of the gate dielectric layer 221, the polysilicon layer 222, the gate metal layer 223, and the gate cap layer 224, as shown in FIG. 2B. In other embodiments, the spacer layer 225 does not cover the top surface of the gate cap layer 224.

The first source/drain region 230 and the second source/drain region 235 may be disposed in the substrate 202 and located on the opposite sides of the gate structure 220. An in-situ doping process or an ion implantation process may be performed on the substrate 202 to form the first source/drain region 230 and the second source/drain region 235 in the substrate 202.

Figure 3:
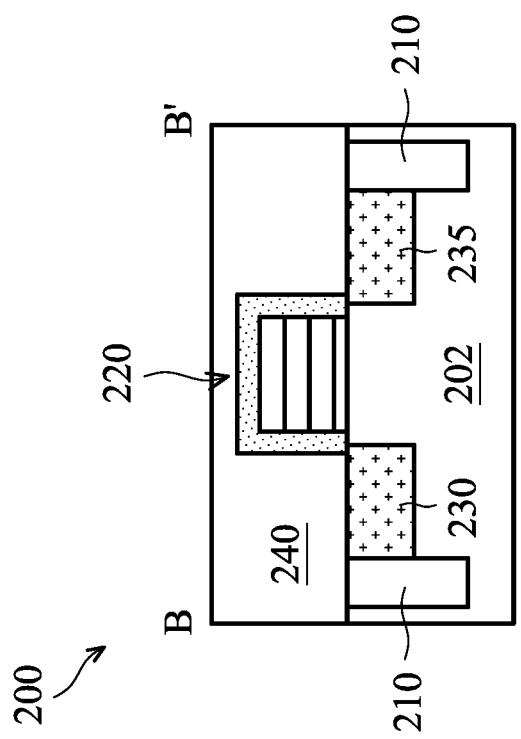

FIG. 3 illustrates a cross-sectional view of an exemplary intermediate structure during the formation of the semiconductor device 200, wherein FIG. 3 follows FIG. 2B. An interlayer dielectric (ILD) layer 240 is formed over the substrate 202, the isolation structures 210, the gate structure 220, the first source/drain region 230, and the second source/drain region 235.

Figure 4:
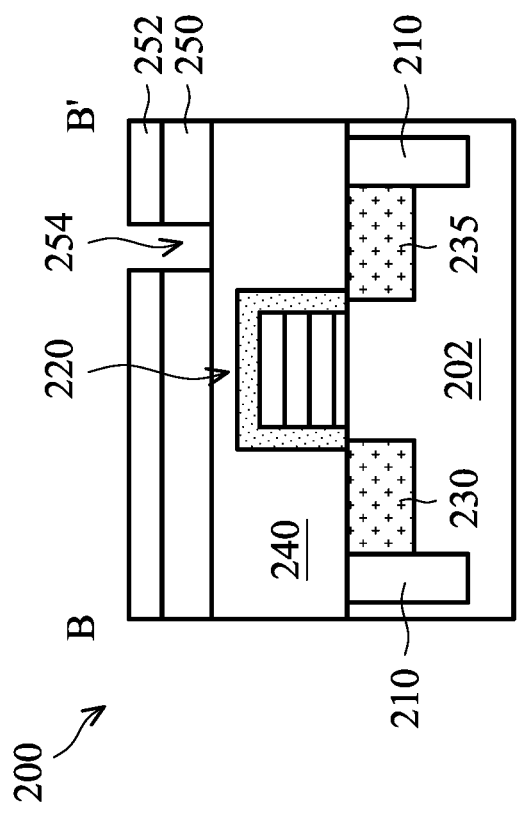

FIG. 4 illustrates a cross-sectional view of an exemplary intermediate structure during the formation of the semiconductor device 200, wherein FIG. 4 follows FIG. 3. A hard mask layer 250 and a photoresist layer 252 are formed over the ILD layer 240, and an opening 254 is formed in the hard mask layer 250.

The hard mask layer 250 may be formed on the ILD layer 240 by a deposition process. A photoresist material may be formed on the hard mask layer 250 and be patterned using a photolithography process to form patterned photoresist layer 252. The patterned photoresist layer 252 functions as etching mask. Then, an opening 254 is formed in the hard mask layer 250 by an etching process. Afterwards, the photoresist layer 252 may be removed by a suitable process.

Figure 5:
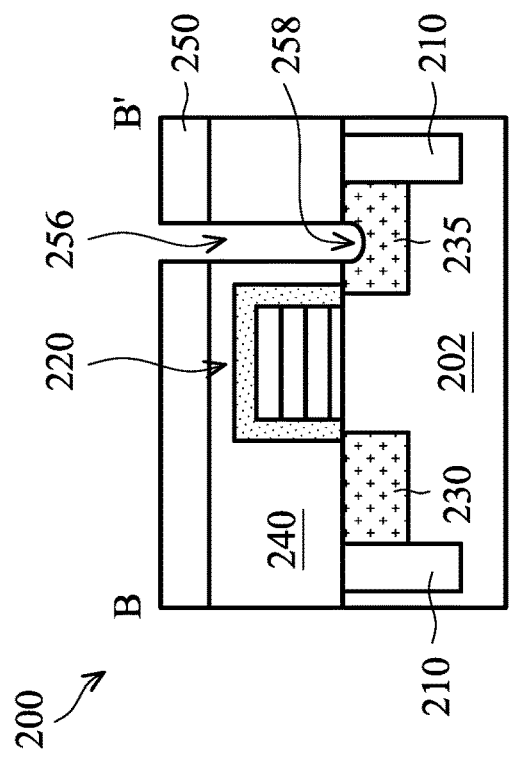

FIG. 5 illustrates a cross-sectional view of an exemplary intermediate structure during the formation of the semiconductor device 200, wherein FIG. 5 follows FIG. 4. A trench 256 including a recess 258 is formed in the ILD layer 240 and the second source/drain region 235.

The patterned hard mask layer 250 may be used as an etching mask, and the trench 256 including the recess 258 is formed in the ILD layer 240 and the second source/drain region 235 by an etching process. The trench 256 extends through the ILD layer 240, extends into the second source/drain region 235, and forms the recess 258 in the second source/drain region 235. The recess 258 has a shape that is wide in the upper portion and narrow in the lower portion. For example, in the cross-sectional view of FIG. 5, the recess 258 is arc-shaped or called bowl-shaped.

In some embodiments, the trench 256 and the recess 258 may be formed by over-etching in a single etching process so as to form the entire trench 256 including the recess 258 at the same time. In other embodiments, the trench 256 and recess 258 may be formed by performing a first etching process and a second etching process. The first etching process forms the portion of the trench 256 in the ILD layer 240, and the second etching process forms the portion of the trench 256 in the second source/drain region 235 (i.e., the recess 258).

Figure 6:
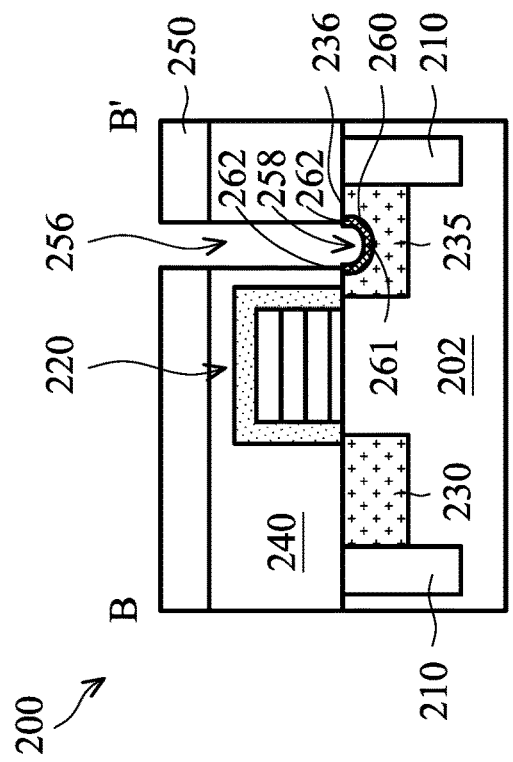

FIG. 6 illustrates a cross-sectional view of an exemplary intermediate structure during the formation of the semiconductor device 200, wherein FIG. 6 follows FIG. 5. A dielectric layer 260 may be conformally formed in the recess 258. The dielectric layer may include a material that is the same as or similar to the material of the gate dielectric layer 221. In some embodiments, the dielectric layer 260 does not include transition metal oxides.

Since the dielectric layer 260 is conformally formed in the recess 258, the dielectric layer 260 also has a shape that is wide in the upper portion and narrow in the lower portion in the cross-sectional view of FIG. 6. As shown in FIG. 6, the dielectric layer 260 is arc-shaped (or bowl-shaped). The dielectric layer 260 includes an edge portion 262 and a central portion 261 that is lower than the edge portion 262. The height of the edge portion 262 is lower than or level with an upper surface 236 of the second source/drain region 235. In some embodiments, the thickness of the dielectric layer 260 (e.g., the height of the central portion 261) may be in a range from 2 nm to 10 nm, but the present invention is not limited thereto, the dielectric layer 260 may have any suitable thickness.

In some embodiments, the dielectric layer 260 may be formed in the recess 258 by an in-situ steam generation (ISSG) process or other suitable deposition process. After the dielectric layer 260 is formed, the hard mask layer 250 can be removed by an etching process, alternatively, the hard mask layer 250 can be removed first and then the dielectric layer 260 can be formed.

Figure 7:
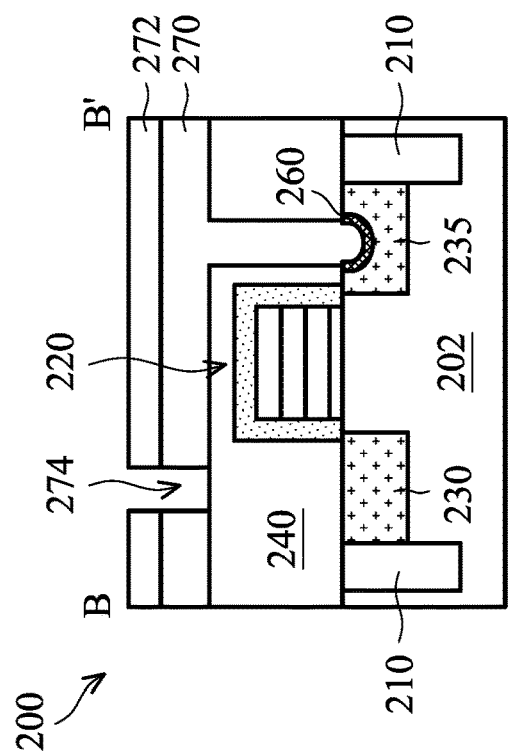

FIG. 7 illustrates a cross-sectional view of an exemplary intermediate structure during the formation of the semiconductor device 200, wherein FIG. 7 follows FIG. 6. A hard mask layer 270 and a photoresist layer 272 are formed over the ILD layer 240, and an opening 274 is formed in the hard mask layer 270.

The hard mask layer 270 may include a material that is the same as or similar to the material of the hard mask layer 250, and may be formed by a suitable deposition process. In some embodiments, the hard mask layer 270 may temporarily fill the trench 256. A photoresist material may be formed on the hard mask layer 270 and be patterned using a photolithography process to form patterned photoresist layer 272. The patterned photoresist layer 272 functions as etching mask. Then, an opening 274 is formed in the hard mask layer 270 by an etching process. Afterwards, the photoresist layer 272 may be removed by a suitable process.

Figure 8:
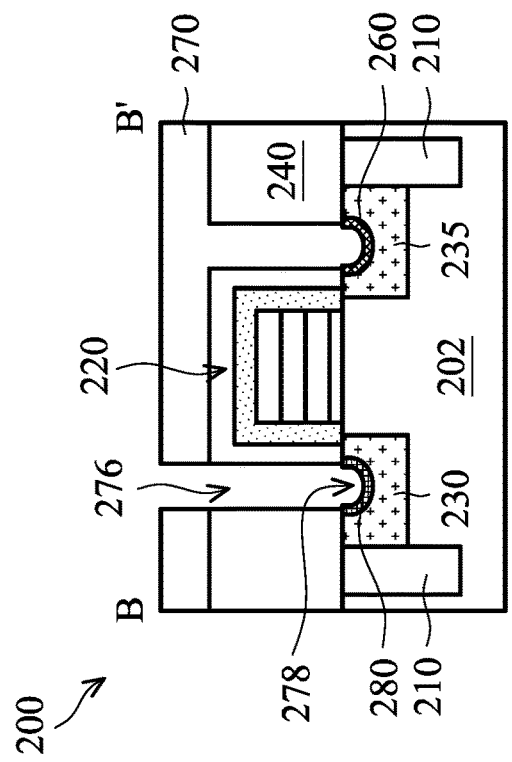

FIG. 8 illustrates a cross-sectional view of an exemplary intermediate structure during the formation of the semiconductor device 200, wherein FIG. 8 follows FIG. 7. A trench 276 including a recess 278 is formed in the ILD layer 240 and the first source/drain region 230. A silicide layer 280 may be formed in the recess 278.

The patterned hard mask layer 270 may be used as an etching mask, and the trench 276 including the recess 278 is formed in the ILD layer 240 and the first source/drain region 230 by an etching process. The trench 276 extends through the ILD layer 240, extends into the first source/drain region 230, and forms the recess 278 in the first source/drain region 230. Similar to the trench 256, the trench 276 including the recess 278 may be formed by a single etching process or two etching processes.

The silicide layer 280 is formed in the recess 278 to reduce the resistance between the first source/drain region 230 and a first source/drain contact 290 that is formed subsequently. In some embodiments, the thickness of the silicide layer 280 (e.g., the height of the central portion) may be in a range from 2 nm to 10 nm, but the present invention is not limited thereto, the silicide layer 280 may have any suitable thickness. The hard mask layer 270 may be removed by an etching process.

Figure 9:
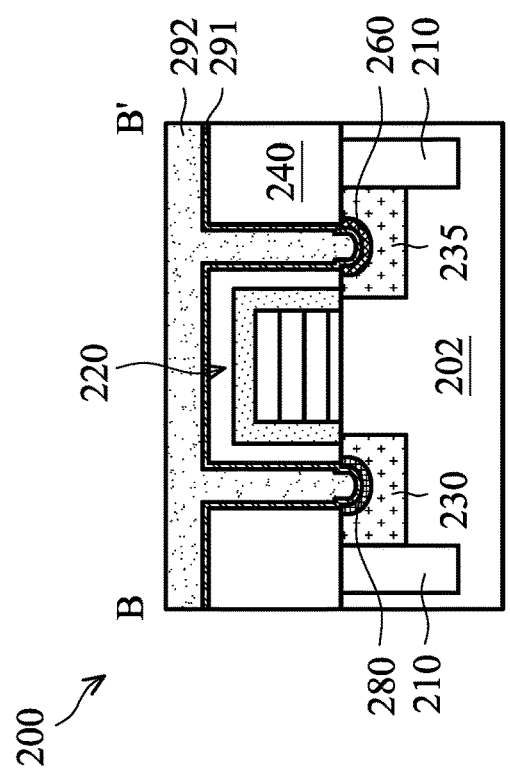

FIG. 9 illustrates a cross-sectional view of an exemplary intermediate structure during the formation of the semiconductor device 200, wherein FIG. 9 follows FIG. 8. A glue material layer 291 and a metal fill material layer 292 are formed in the trench 256 and the trench 276.

In some embodiments, the glue material layer 291 may include titanium (Ti), titanium nitride (TiN), tantalum (Ta), tantalum nitride (TaN), tungsten nitride (WN), or combinations thereof. In some embodiments, the metal fill material layer 292 may include tungsten (W), copper (Cu), aluminum (Al), cobalt (Co), ruthenium (Ru), molybdenum (Mo), tantalum, titanium, alloys thereof, and/or combinations thereof.

The glue material layer 291 may be conformally formed in the recess 256 and the recess 276 by a suitable deposition process. The glue material layer 291 covers an upper surface of the ILD layer 240, sidewalls of the trench 256 and the trench 276, the dielectric layer 260 at the bottom of the trench 256, and the silicide layer 280 at the bottom of the trench 276. Then, the metal fill material layer 292 may be formed on the glue material layer 291 by a suitable deposition process.

Figure 10:
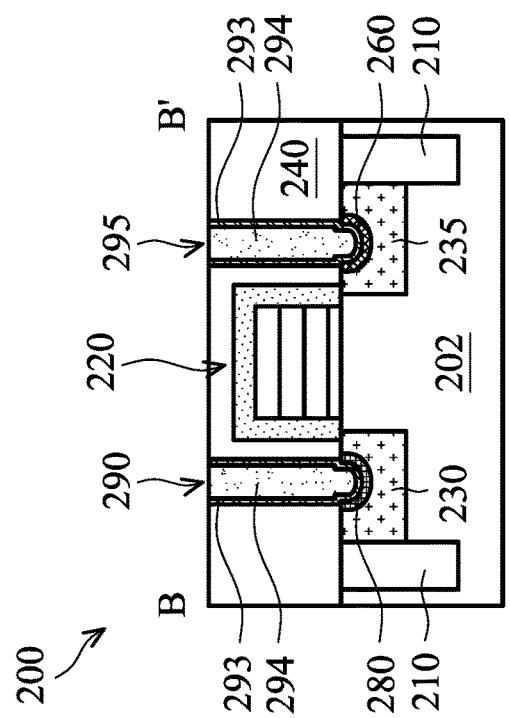

FIG. 10 illustrates a cross-sectional view of an exemplary intermediate structure during the formation of the semiconductor device 200, wherein FIG. 10 follows FIG. 9. A first source/drain contact 290 is formed on the first source/drain region 230 and in the trench 276. A second source/drain contact 295 is formed on the second source/drain region 235 and in the trench 256.

The excess material of the glue material layer 291 and the metal fill material layer 292 is removed from the upper surface of the ILD layer 240 to form a glue layer 293 and a metal fill layer 294 in the trench 256 and the trench 276. The glue layer 293 and the metal fill layer 294 in the trench 276 constitute the first source/drain contact 290, and the glue layer 293 and the metal fill layer 294 in the trench 256 constitute the second source/drain contact 295. The first source/drain contact 290 fills the remaining portions of the trench 276 and the recess 278 that remain after the silicide layer 280 is formed, sandwiching the silicide layer 280 between the first source/drain region 230 and the first source/drain contact 290. The second source/drain contact 295 fills the remaining portions of the trench 256 and the recess 258 that remain after the dielectric layer 260 is formed, sandwiching the dielectric layer 260 between the second source/drain region 235 and the second source/drain contacts 295.

Figure 11B:
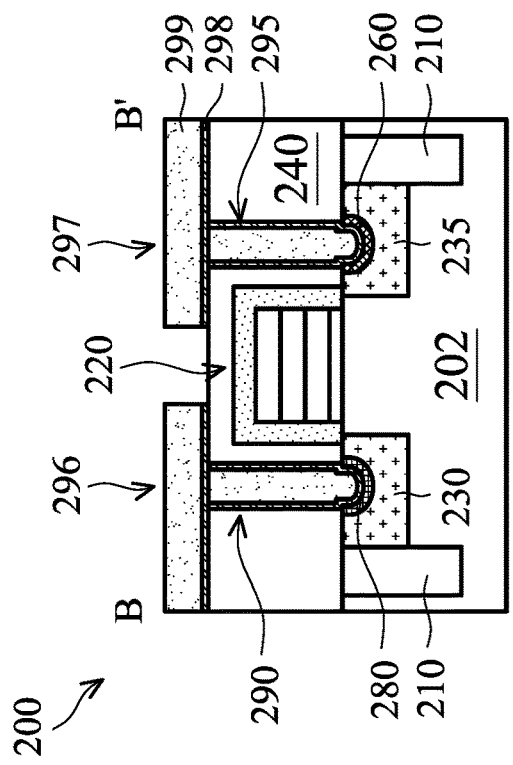
Figure 11A:
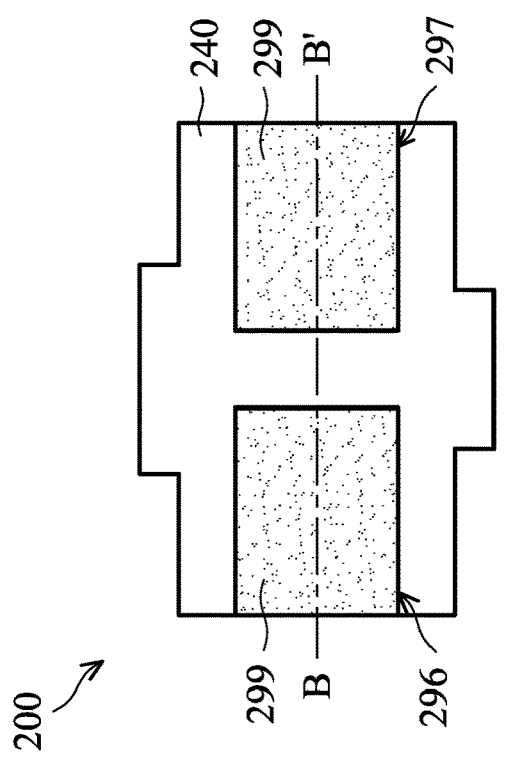

FIG. 11A illustrates a top view of an exemplary structure of the semiconductor device 200. FIG. 11B illustrates a cross-sectional view taken along a line B-B' of FIG. 11A. A first conductive line 296 is formed on the first source/drain contact 290. A second conductive line 297 is formed on the second source/drain contact 295.

The material layer of glue layers 298 and the material layer of metal fill layers 299 are formed on the ILD layer 240, the first source/drain contact 290, and the second source/drain contact 295 by suitable deposition processes. Then, the material layers of the glue layers 298 and the metal fill layers 299 are patterned by photolithography and etching processes to form the patterned glue layers 298 and the patterned metal fill layers 299 on the first source/drain contact 290 and the second source/drain contact 295. The glue layer 298 and the metal fill layer 299 on the first source/drain contact 290 constitute the first conductive line 296, and the glue layer 298 and the metal fill layer 299 on the second source/drain contact 295 constitute the second conductive line 297. The first conductive line 296 may function as a bit line, and the second conductive line 297 may function as a source line.

The semiconductor device 200 integrates the select transistor and the programming transistor of the conventional anti-fuse cell into a single transistor. As shown in FIG. 11B, the semiconductor device 200 includes the dielectric layer 260 disposed between the second source/drain region 235 and the second source/drain contact 295. The dielectric layer 260 may function as a breakdown dielectric layer. Therefore, the second source/drain contact 295 including the dielectric layer 260 can be regarded as an anti-fuse device and replaces the conventional programming transistor. Meanwhile, the gate structure 220, the first source/drain region 230 and the second source/drain region 235 in the semiconductor device 200 constitute the select transistor.

In order to program the semiconductor device 200, a voltage may be applied to the gate structure 220 to turn on the semiconductor device 200. Then, a sufficiently high voltage is applied to the first source/drain region 230 through the first conductive line 296 (i.e., the bit line) and the first source/drain contact 290, and a sufficiently low voltage is applied to the second source/drain contact 295 through the second conductive line 297 (i.e., the source line). In this way, a voltage difference will be generated on the dielectric layer 260. When the voltage difference is great enough, the dielectric layer 260 will breakdown (or called "burn").

Before the dielectric layer 260 is burned, the resistance between the first conductive line 296 (i.e., the bit line) and the second conductive line 297 (i.e., the source line) is higher. After the dielectric layer 260 is burned, the resistance between the first conductive line 296 (i.e., the bit line) and the second conductive line 297 (i.e., the source line) is lower. With the high resistance before the dielectric layer 260 is burned and the low resistance after the dielectric layer 260 is burned, the semiconductor device 200 can store different logic states.

The dielectric layer 260 may be regarded as a part of the second source/drain contact 295. By disposing the dielectric layer 260, the semiconductor device 200 can integrate the anti-fuse device in the second source/drain contact 295. Therefore, the anti-fuse device does not occupy the area other than the select transistor. Accordingly, the semiconductor device 200 only needs the area of one transistor. That is, compared with the conventional anti-fuse cell requiring two transistors, the semiconductor device 200 provided by the present invention can significantly save the area of the wafer.

Meanwhile, since the semiconductor device 200 integrates the anti-fuse device into the second source/drain contact 295, when the semiconductor device 200 is used as a memory, the array of semiconductor devices 200 may have a density comparable to that of a volatile dynamic random access memory (DRAM) array.

Moreover, as shown in FIG. 11A to FIG. 11B, the dielectric layer 260 has a shape that is wide in the upper portion and narrow in the lower portion and is arc-shaped. That is, the dielectric layer 260 has a narrower tip. According to the principle of point discharge, the tip of the dielectric layer 260 is more likely to breakdown. As a result, when the dielectric layer 260 is burned, the burned region of the dielectric layer 260 will be more concentrated, so that the resistance between the first conductive line 296 (i.e., the bit line) and the second conductive line 297 (i.e., the source line) of the semiconductor device 200 has a uniform distribution. In this way, the operation of determining the logic state of the semiconductor device 200 will not be affected. Therefore, compared with the conventional anti-fuse cell, the semiconductor device 200 provided by the present invention can significantly improve the uniformity of the anti-fuse cell.

Figure 12:
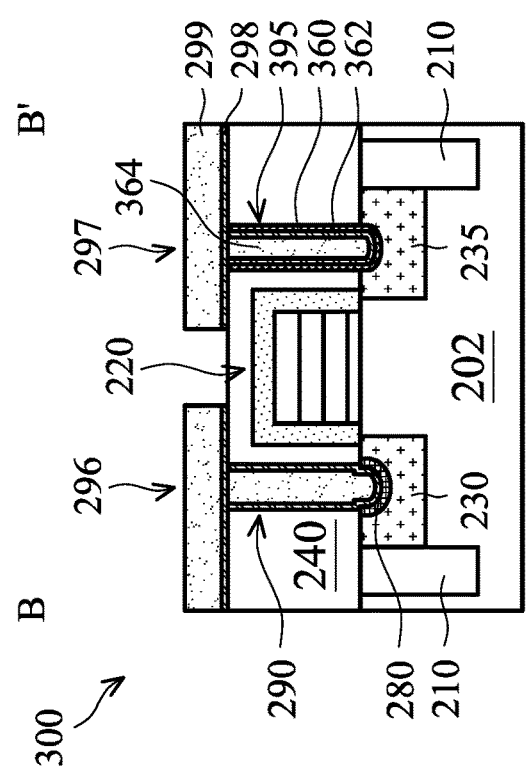

FIG. 12 illustrates a cross-sectional view of an exemplary structure of a semiconductor device 300 (or called anti-fuse cell). The semiconductor device 300 includes a structure similar to that of the semiconductor device 200, except the structure of the second source/drain contact 395 of the semiconductor device 300 is different than that of the second source/drain contact 295 of the semiconductor device 200.

In some embodiments, the second source/drain contact 395 includes a dielectric layer 360, a glue layer 362, and a metal fill layer 364. Materials of the dielectric layer 360, the glue layer 362, and the metal fill layer 364 may be sequentially formed in the trench 256 by suitable deposition processes, and the excess material is removed by a planarization process to constitute the second source/drain contact 395. The material of the dielectric layer 360 may be the same as or similar to the material of the dielectric layer 260, the material of the glue layer 362 may be the same as or similar to the material of the glue layer 291, and the material of the metal fill layer 364 may be the same as or similar to the material of the metal fill layer 292.

As shown in FIG. 12, the dielectric layer 360 is conformally formed on the sidewall of the trench 256 and on the bottom surface of the recess 258. The dielectric layer 360 extends out of the recess 258 and is U-shaped, and wraps around the second source/drain contact 395 (glue layer 362, metal fill layer 364). A portion of the dielectric layer 360 lower than the upper surface 236 of the second source/drain region 235 has a shape that is wide in the upper portion and narrow in the lower portion and is arc-shaped. Since the dielectric layer 360 is U-shaped and the second source/drain contact 395 extends into the second source/drain region 235, at the bottom of the second source/drain contact 395, the dielectric layer 360 is lower than the upper surface 236 of the second source/drain region 235. The dielectric layer 360 may have a thickness that is the same as or similar to the thickness of the dielectric layer 260.

As shown in FIG. 12, the semiconductor device 300 includes the second source/drain contact 395 having the dielectric layer 360, wherein the dielectric layer 360 also has a narrower tip like the dielectric layer 260. Since the dielectric layer 360 has the same function as the dielectric layer 260, the semiconductor device 300 can provide the same advantages as the semiconductor device 200, such as saving the area of the wafer, providing high density non-volatile memory array density, and improving the uniformity of anti-fuse cells.

In addition, as shown in FIG. 12, since the conductive portion (glue layer 362 and metal fill layer 364) of the second source/drain contact 395 is wrapped around by the dielectric layer 360, the conductive portion of the second source/drain contact 395 is narrower. Therefore, the second source/drain contact 395 of the semiconductor device 300 has a higher resistance. Since the voltage used to burn the dielectric layer (e.g., the dielectric layer 360) is constant, the current decreases as the resistance increases. As a result, the power consumed by the semiconductor device 300 having the second source/drain contact 395 with higher resistance is reduced. Therefore, by applying the semiconductor device 300 provided by the present invention, the power consumption of the anti-fuse cell can be reduced.

Figure 13:
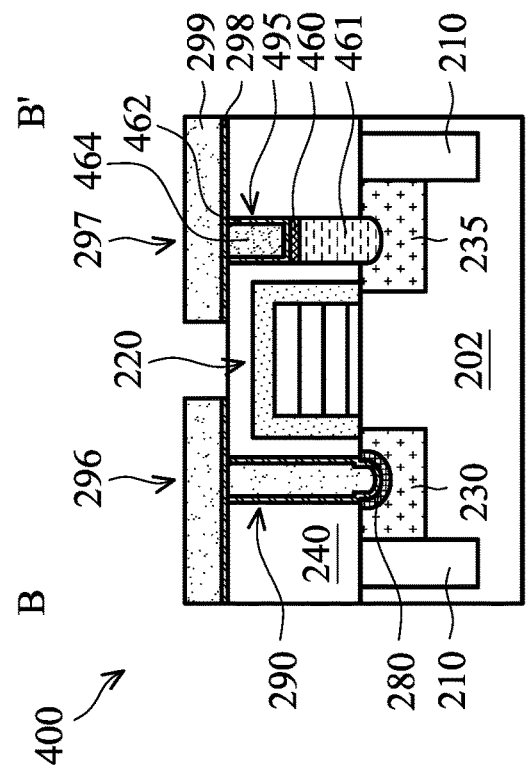
FIGS. 12 to 14 illustrate cross-sectional views of exemplary structures of semiconductor devices, in accordance with some embodiments of the present invention.

FIG. 13 illustrates a cross-sectional view of an exemplary structure of a semiconductor device 400 (or called anti-fuse cell). The semiconductor device 400 includes a structure similar to that of the semiconductor device 200, except the structure of the second source/drain contact 495 of the semiconductor device 400 is different than that of the second source/drain contact 295 of the semiconductor device 200.

In some embodiments, the second source/drain contact 495 includes an upper portion constituted by a glue layer 462 and a metal fill layer 464, a lower portion constituted by a polysilicon layer 461, and a dielectric layer 460 sandwiched between the upper portion and the lower portion. Materials of the polysilicon layer 461, the dielectric layer 460, the glue layer 462, and the metal fill layer 464 may be sequentially formed in the trench 256 by suitable deposition processes, and the excess material is removed by a planarization process to constitute the second source/drain contact 495. The height of the polysilicon layer 461 may be adjusted by an etch back process, and/or doped by an ion implantation process. The material of the dielectric layer 460 may be the same as or similar to the material of the dielectric layer 260, the material of the glue layer 462 may be the same as or similar to the material of the glue layer 291, and the material of the metal fill layer 464 may be the same as or similar to the material of the metal fill layer 292.

As shown in FIG. 13, the dielectric layer 460 between the upper portion (glue layer 462, metal fill layer 464) and the lower portion (polysilicon layer 461) of the second source/drain contact 495 is plate-shaped. In other embodiments, the dielectric layer 460 may be formed to be arc-shaped that is similar to the dielectric layer 260. The dielectric layer 460 may have a thickness that is the same as or similar to the thickness of the dielectric layer 260.

As shown in FIG. 13, the semiconductor device 400 includes the second source/drain contact 495 having the dielectric layer 460. Since the dielectric layer 460 has the same function as the dielectric layer 260, the semiconductor device 400 can provide the same advantages as the semiconductor device 200, such as saving the area of the wafer and providing high density non-volatile memory array density. At the same time, since the area of the source/drain contact is smaller than that of the gate dielectric layer of the transistor, when the dielectric layer in the source/drain contact is burned, the burned region of the dielectric layer is also more concentrated, thereby improving the uniformity of the anti-fuse cell.

In addition, the resistance of the polysilicon layer 461 may be adjusted by adjusting the height and doping concentration of the polysilicon layer 461, thereby adjusting the resistance of the second source/drain contact 495. For example, as the ratio of the polysilicon layer 461 to the conductive portion (i.e., the glue layer 462 and the metal fill layer 464) changes (the position of the dielectric layer 460 changes accordingly) and/or the doping concentration of the polysilicon layer 461 changes, the resistance of the second source/drain contact 495 also changes. By adjusting the doping concentration of the polysilicon layer 461 and/or the position of the dielectric layer 460, the resistance of the second source/drain contact 495 of the semiconductor device 400 can be flexibly set.

Furthermore, as shown in FIG. 13, the second source/drain contact 495 of the semiconductor device 400 includes the polysilicon layer 461. Since the resistance of the polysilicon layer 461 is higher, the second source/drain contact 495 has a higher resistance. Therefore, the semiconductor device 400 can reduce the power consumption of the anti-fuse cell.

Figure 14:
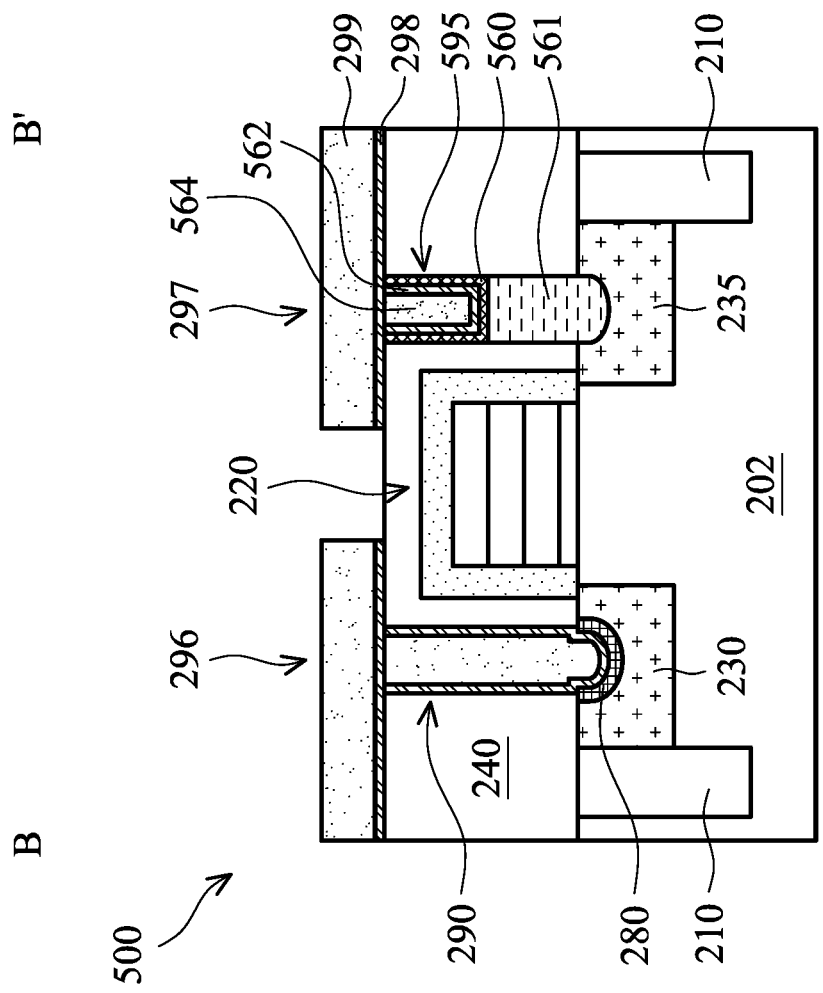

FIG. 14 illustrates a cross-sectional view of an exemplary structure of a semiconductor device 500 (or called anti-fuse cell). The semiconductor device 500 includes a structure similar to that of the semiconductor device 400, except the structure of the second source/drain contact 595 of the semiconductor device 500 is different than that of the second source/drain contact 495 of the semiconductor device 400.

In some embodiments, the second source/drain contact 595 includes an upper portion constituted by a glue layer 562 and a metal fill layer 564, a lower portion constituted by a polysilicon layer 561, and a dielectric layer 560 sandwiched between the upper portion and the lower portion. Materials of the polysilicon layer 561, the dielectric layer 560, the glue layer 562, and the metal fill layer 564 may be sequentially formed in the trench 256 by suitable deposition processes, and the excess material is removed by a planarization process to constitute the second source/drain contact 595. The material of the polysilicon layer 561 may be the same as or similar to the material of the polysilicon layer 461, the material of the dielectric layer 560 may be the same as or similar to the material of the dielectric layer 260, the material of the glue layer 562 may be the same as or similar to the material of the glue layer 291, and the material of the metal fill layer 564 may be the same as or similar to the material of the metal fill layer 292.

As shown in FIG. 14, the dielectric layer 560 is sandwiched between the upper portion and the lower portion of the second source/drain contact 595, and the dielectric layer 560 is U-shaped and wraps around the upper portion of the source/drain contact 595 (glue layer 562 and metal fill layer 564). Since the upper portion of the second source/drain contact 595 is wrapped around by the dielectric layer 560, the width of the upper portion (glue layer 562 and metal fill layer 564) is less than the width of the lower portion (polysilicon layer 561). In the depicted embodiment, the bottom of the dielectric layer 560 is formed to be plate-shaped. In other embodiments, the bottom of the dielectric layer 560 may be formed to be arc-shaped that is similar to the dielectric layer 260. The dielectric layer 560 may have a thickness that is the same as or similar to the thickness of the dielectric layer 260.

As shown in FIG. 14, the semiconductor device 500 includes the second source/drain contact 595 having the dielectric layer 560. Since the dielectric layer 560 has the same function as the dielectric layer 460, the semiconductor device 500 can provide the same advantages as the semiconductor device 400, such as saving the area of the wafer, providing high density non-volatile memory array density, improving the uniformity of the anti-fuse cells, flexibly setting the resistance of the second source/drain contact, and reducing the power consumption of the anti-fuse cells.

Figure 15:
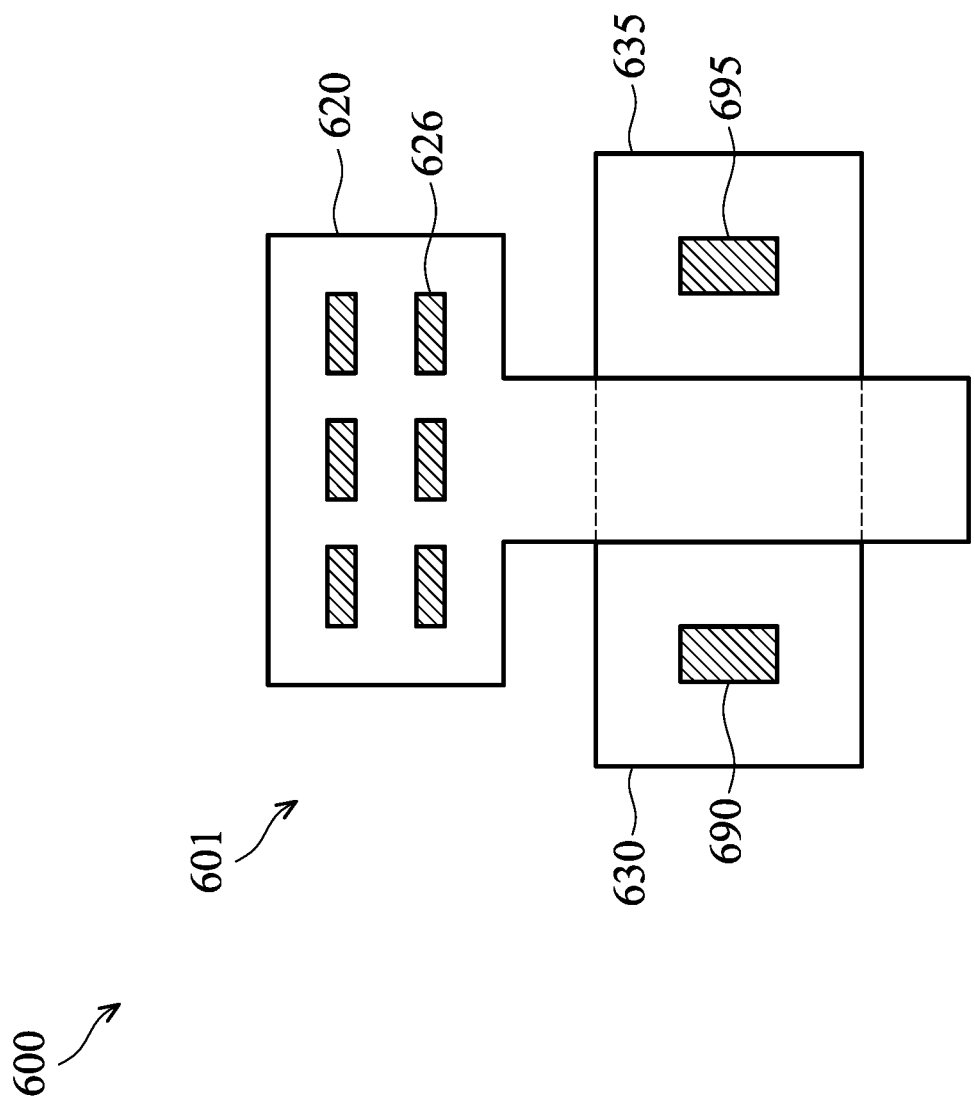
FIG. 15 illustrates an exemplary layout of a semiconductor device, in accordance with some embodiments of the present invention.

FIG. 15 illustrates an exemplary layout 600 of the semiconductor device. The exemplary layout 600 may be applied to the semiconductor devices 200, 300, 400, and 500. The exemplary layout 600 only includes a transistor 601. The transistor 601 includes a gate structure 620, a gate contact 626 on the gate structure 620, a first source/drain region 630 and a second source/drain region 635 in the active region, a first source/drain contact 690 on the first source/drain region 630, and a second source/drain contact 695 on the second source/drain region 635.

By disposing the breakdown dielectric layer of the anti-fuse device into one of the source/drain contacts (e.g., the first or second source/drain contact), the select transistor and the programming transistor of the anti-fuse cell can be integrated into a single transistor (e.g., the transistor 601). Compared with the layout of the conventional anti-fuse cell shown in FIG. 1B, the exemplary layout 600 shown in FIG. 15 significantly reduces the occupied area. As a result, the precious area of the wafer can be saved and the memory array with higher density can be provided.

Furthermore, since the select transistor and the programming transistor are integrated into a single transistor, there is no need to form a plurality of parallel source/drain contacts for reducing the resistance between the select transistor and the programming transistor. Therefore, the process can be simplified and/or the process window can be increased by forming a larger single source/drain contact.

The foregoing has outlined features of several embodiments so that those skilled in the art may better understand the detailed description that follows. Those skilled in the art should readily realize that they may make various changes, substitutions, and alterations herein while these equivalent structures do not depart from the spirit and scope of the present disclosure.

What is claimed is:

1. A semiconductor device, comprising:
a substrate;
a first source/drain region and a second source/drain region, disposed within the substrate;
a gate structure, disposed on the substrate and between the first source/drain region and the second source/drain region;
an interlayer dielectric layer, disposed over the first source/drain region, the second source/drain region, and the gate structure, wherein the interlayer dielectric layer comprises a second trench extending into the second source/drain region;
a dielectric layer, disposed in the second trench; and
a second source/drain contact, disposed over the second source/drain region and filling a remaining portion of the second trench.

2. The semiconductor device as claimed in claim 1, wherein the dielectric layer is between the second source/drain region and the second source/drain contact, covers a bottom of the second trench, and is arc-shaped, wherein a central portion of the dielectric layer is lower than an upper surface of the second source/drain region, and wherein an edge portion of the dielectric layer is level with or lower than the upper surface of the second source/drain region but is higher than the central portion.

3. The semiconductor device as claimed in claim 1, wherein the dielectric layer covers a bottom and a sidewall of the second trench, such that the dielectric layer is U-shaped and wraps around the second source/drain contact, wherein the dielectric layer at a bottom portion of the source/drain contact is lower than an upper surface of the second source/drain region.

4. The semiconductor device as claimed in claim 1, further comprising a second conductive line, wherein the second conductive line is disposed over and in contact with the second source/drain contact.

5. The semiconductor device as claimed in claim 4, wherein the second conductive line is a source line.

6. The semiconductor device as claimed in claim 1, wherein the interlayer dielectric layer further comprises a first trench extending into the first source/drain region, and a silicide layer disposed in the bottom of the first trench.

7. The semiconductor device as claimed in claim 6, further comprising a first source/drain contact disposed over the first source/drain region and filling a remaining portion of the first trench, such that the silicide layer is between the first source/drain region and the first source/drain contact.

8. The semiconductor device as claimed in claim 6, further comprising a first conductive line, wherein the first conductive line is disposed over and in contact with the first source/drain contact.

9. The semiconductor device as claimed in claim 8, wherein the first conductive line is a bit line.

10. The semiconductor device as claimed in claim 1, wherein the second source/drain contact comprises a lower portion in contact with the second source/drain region and an upper portion disposed on the lower portion, and wherein the dielectric layer is disposed between the lower portion and the upper portion.

11. The semiconductor device as claimed in claim 10, wherein the dielectric layer is plate-shaped.

12. The semiconductor device as claimed in claim 10, wherein the dielectric layer is U-shaped, and wherein the dielectric layer wraps around the upper portion of the second source/drain contact, such that a width of the upper portion is less than a width of the lower portion.

13. The semiconductor device as claimed in claim 10, wherein the lower portion of the second source/drain contact includes polysilicon.

14. A method for forming a semiconductor device, comprising:
providing a substrate;
forming a gate structure on the substrate;
forming a first source/drain region and a second source/drain region in the substrate, wherein the first source/drain region and the second source/drain region are located on opposite sides of the gate structure;
forming an interlayer dielectric layer on the gate structure, the first source/drain region, and the second source/drain region;
etching the interlayer dielectric layer and the second source/drain region to form a second source/drain trench, wherein the second source/drain trench comprises a second recess within the second source/drain region;
forming a dielectric layer in the second source/drain trench; and
forming a second source/drain contact in the second source/drain trench.

15. The method as claimed in claim 14, wherein the forming the dielectric layer comprises forming the dielectric layer within the second recess, wherein the dielectric layer is arc-shaped and a central portion of the dielectric layer is lower than an upper surface of the second source/drain region, and wherein an edge portion of the dielectric layer is level with or lower than the upper surface of the second source/drain region but is higher than the central portion.

16. The method as claimed in claim 14, wherein the forming of the dielectric layer comprises forming the dielectric layer within the second source/drain trench, wherein the dielectric layer is U-shaped and in contact with a bottom of the second recess and a sidewall of the second source/drain trench.

17. The method as claimed in claim 14, further comprising:
forming a polysilicon layer within the second source/drain trench before forming the dielectric layer;
forming the dielectric layer on the polysilicon layer; and
forming a conductive material on the dielectric layer.

18. The method as claimed in claim 14, further comprising:
forming a polysilicon layer within the second source/drain trench before forming the dielectric layer;

forming the dielectric layer on the polysilicon layer and on a sidewall of a remaining portion of the second source/drain trench, wherein the dielectric layer is U-shaped; and forming a conductive material on the dielectric layer.

19. The method as claimed in claim 14, further comprising: etching the interlayer dielectric layer and the first source/drain region to form a first source/drain trench, wherein the first source/drain trench comprises a first recess within the first source/drain region; forming a silicide layer in the first recess; and forming a first source/drain contact in the first source/drain trench.

20. The method as claimed in claim 19, further comprising:

forming a first conductive line on the first source/drain contact, wherein the first conductive line is in contact with the first source/drain contact and is a bit line; and forming a second conductive line on the second source/drain contact, wherein the second conductive line is in contact with the second source/drain contact and is a source line.

\* \* \* \* \*